United States Patent
Bando et al.

(10) Patent No.: US 10,326,064 B2
(45) Date of Patent: Jun. 18, 2019

(54) LIGHT EMITTING DEVICE AND METHOD OF MANUFACTURING SAME

(71) Applicant: NICHIA CORPORATION, Anan-shi, Tokushima (JP)

(72) Inventors: Shusaku Bando, Anan (JP); Dai Wakamatsu, Anan (JP); Takeshi Kususe, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/955,391

(22) Filed: Apr. 17, 2018

(65) Prior Publication Data

US 2018/0309035 A1 Oct. 25, 2018

(30) Foreign Application Priority Data

Apr. 25, 2017 (JP) .................................. 2017-086231
Jan. 19, 2018 (JP) .................................. 2018-006953

(51) Int. Cl.
*H01L 33/48* (2010.01)
*H01L 33/50* (2010.01)
*H01L 33/60* (2010.01)

(52) U.S. Cl.
CPC ............ *H01L 33/60* (2013.01); *H01L 33/486* (2013.01); *H01L 33/507* (2013.01);
(Continued)

(58) Field of Classification Search
CPC ...... H01L 33/486; H01L 33/507; H01L 33/60
See application file for complete search history.

(56) References Cited

U.S. PATENT DOCUMENTS

2010/0320479 A1* 12/2010 Minato ................. H01L 33/505
257/88
2013/0033169 A1 2/2013 Ito et al.
(Continued)

FOREIGN PATENT DOCUMENTS

EP 2119754 A2 11/2009
JP 2003-008073 A 1/2003
(Continued)

OTHER PUBLICATIONS

Extended European Search Report of the corresponding European Patent Application No. 18167598.4, dated Sep. 26, 2018.

*Primary Examiner* — Joseph M Galvin, III
(74) *Attorney, Agent, or Firm* — Global IP Counselors, LLP

(57) ABSTRACT

A light emitting device includes a light emitting element, a light transmissive member, and a cover member. The light transmissive member is disposed on an upper face of the light emitting element. The cover member covers a lateral face of the light emitting element and a lateral face of the light transmissive member, and includes first and second cover members. The first cover member is disposed adjacent to the lateral face of the light emitting element and the lateral face of the light transmissive member, and contains a first light reflecting material and a fluorine-based first resin. The second cover member covers the first cover member, and contains a second light reflecting material and a second resin. A refractive index difference between the first light reflecting material and the first resin is larger than a refractive index difference between the second light reflecting material and the second resin.

20 Claims, 4 Drawing Sheets

(52) U.S. Cl.
CPC .............. *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | |
|---|---|---|
| 2015/0243856 A1 | 8/2015 | Yamada et al. |
| 2015/0380622 A1* | 12/2015 | Miyoshi ............... H01L 33/486 257/88 |
| 2016/0093780 A1* | 3/2016 | Beppu .................... H01L 33/60 257/98 |
| 2016/0172553 A1 | 6/2016 | Toita et al. |
| 2016/0240746 A1 | 8/2016 | Yun et al. |
| 2016/0351765 A1 | 12/2016 | Suzuki |
| 2017/0229624 A1 | 8/2017 | Beppu et al. |

FOREIGN PATENT DOCUMENTS

| | | |
|---|---|---|
| JP | 2007-214592 A | 8/2007 |
| JP | 2010-047773 A | 3/2010 |
| JP | 2010-157638 A | 7/2010 |
| JP | 2012-243822 A | 12/2012 |
| JP | 2013-038187 A | 2/2013 |
| JP | 2016-072304 A | 5/2016 |
| JP | 2016-219743 A | 12/2016 |
| WO | 2014178288 A1 | 11/2014 |

\* cited by examiner

LIGHT EMITTING DEVICE AND METHOD OF MANUFACTURING SAME

CROSS-REFERENCE TO RELATED APPLICATION

This application claims priority to Japanese Patent Application No. 2017-086231 filed on Apr. 25, 2017, and Japanese Patent Application No. 2018-006953 filed on Jan. 19, 2018, the disclosures of which are hereby incorporated by reference in its entirety.

BACKGROUND

The present disclosure relates to a light emitting device and a method of manufacturing the same.

In conventional light emitting devices, a resin imparted with light reflecting properties by having a light transmissive resin contain a light reflecting filler has been utilized as a fight reflecting member to surround a light emitting element as disclosed in Japanese Unexamined Patent Application Publication No. 2012-243822

Furthermore, Japanese Unexamined Patent Application Publication No. 2010-047773 discloses a light emitting device which includes an LED mounted in the recess of a package formed by using a resin material containing 46 wt % or more of a light reflecting filler. A light emitting device having good light extraction efficiency is desired.

SUMMARY

One object of the present disclosure is to provide a light emitting device having higher light extraction efficiency and a method of manufacturing the same.

A light emitting device according to certain embodiment of the present disclosure includes a light emitting element, a light transmissive member, and a cover member. The light transmissive member is disposed on an upper face of the light emitting element. The cover member having light reflectivity covers a lateral face of the light emitting element and a lateral face of the light transmissive member. The cover member includes a first cover member and a second cover member. The first cover member is disposed adjacent to the lateral face of the light emitting element and the lateral face of the light transmissive member, and contains a first light reflecting material and a first resin that is composed of a fluorine-based resin. The second cover member covers the first cover member, and contains a second light reflecting material and a second resin.

A refractive index difference between the first light reflecting material and the first resin is preferably larger than a refractive index difference between the second light reflecting material and the second resin.

A method of manufacturing a light emitting device according to certain embodiment of the present disclosure includes: disposing a first mixture containing a first light reflecting material and a first resin composed of a fluorine-based resin to surround a light emitting element; forming a first cover member in contact with the light emitting element by heating the first mixture; and forming a second cover member covering the first cover member by disposing a second mixture containing a second light reflecting material and a second resin to surround the first cover member.

According to the certain embodiments of the present disclosure, a light emitting device capable of achieving a further luminous flux increase and a method of manufacturing the same can be provided.

DESCRIPTION

Figure 1A:
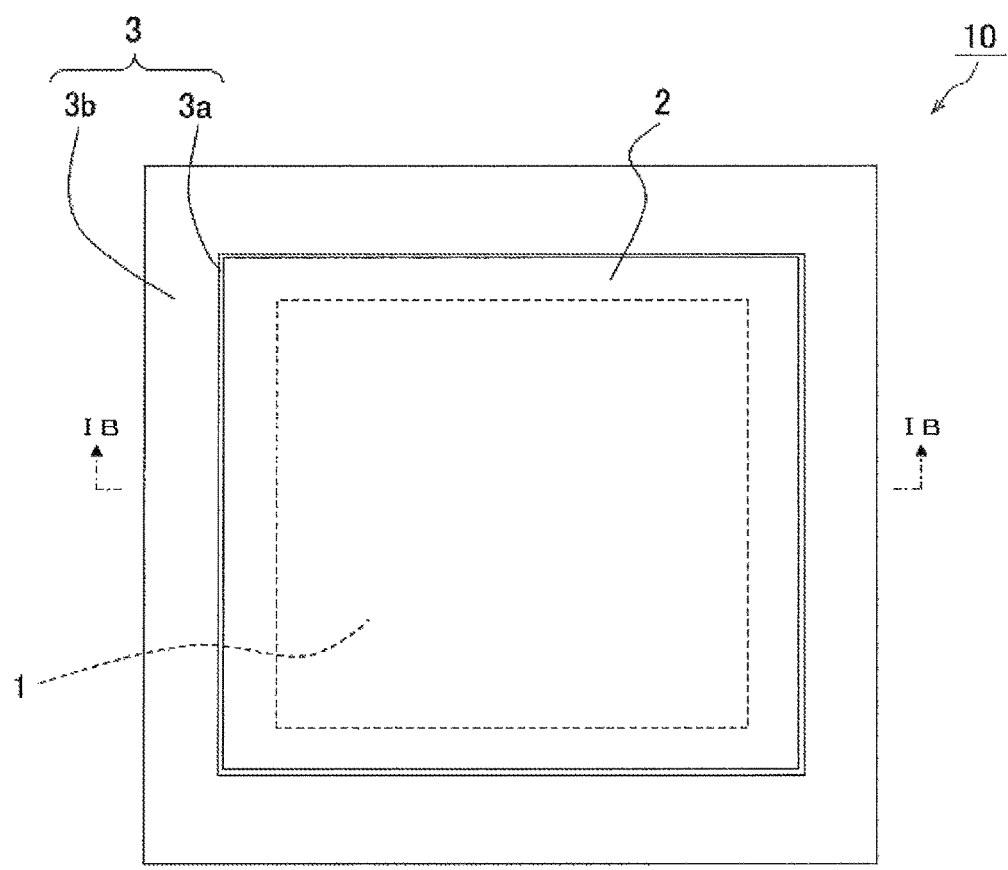
FIG. 1A is a schematic plan view of the light emitting device according to one embodiment of the present disclosure.

The sizes and the positional relationship of the members shown in each drawing herein might be exaggerated for clarity of explanations. Furthermore, as a rule herein, the same designations and reference numerals denote the same members or those of similar quality.

Light Emitting Device 10

Figure 1B:
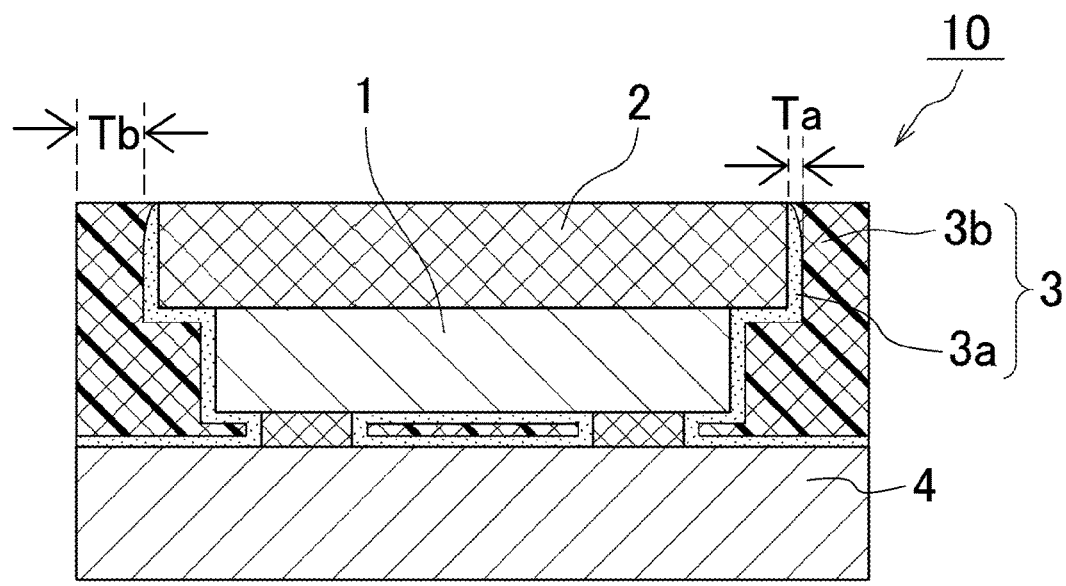
FIG. 1B is a schematic cross-sectional view taken along line IB-IB in FIG. 1A.

As shown in FIGS. 1A and 1B for example, the light emitting device 10 according to the present embodiment includes a light emitting element 1, a light transmissive member 2 disposed on the upper face of the light emitting element 1, and a light reflecting cover member 3 which covers the lateral faces of the light emitting element 1 and the lateral faces of the light transmissive member 2. The upper face here means the light extraction face of the light emitting element. The cover member includes a first cover member and a second cover member. The first cover member covers the lateral faces of the light emitting element and the lateral faces of the light transmissive member 2, and contains a first light reflecting material and a first resin composed of a fluorine-based resin. The second cover member covers the first cover member, and contains a second light reflecting material and a second resin. The refractive index difference between the first light reflecting material and the first resin is larger than the refractive index difference between the second light reflecting material and the second resin.

As described above, the first cover member contains the first light reflecting material and the first resin having a large refractive index difference therebetween. Also, the second cover member contains the second light reflecting material and the second resin having a smaller refractive index difference therebetween. Thus, covering the lateral faces of the light emitting element with the first cover member can further facilitate reflection of the emitted light from the light emitting element as compared to a case where the lateral faces of the light emitting element are covered with the second cover member. Accordingly, this can make the light emitting device 10 capable of reducing light leakage from the cover member and having the upper surface of the light transmissive member 2 as the light extraction surface a light emitting device having higher light extraction efficiency.

Cover Member 3

The cover member 3 covers the lateral faces of the light emitting element 1 and the lateral faces of the light transmissive member 2. The cover member 3 may also cover the lower face of the light emitting element 1.

The cover member 3 preferably is highly reflective, for example, a reflectance of 60% or higher 70% or higher, 75% or higher, or 85% or higher relative to the light emitted by the light emitting element described later.

The cover member 3 includes the first cover member 3a that contains a first light reflecting material and the first resin The second cover member 3b that covers the first cover member 3a and contains the second light reflecting material and the second resin. In other words, the first cover member 3a is formed with the first light reflecting material and the first resin. The first resin is composed of a fluorine-based resin. Also, the second cover member 3b is formed with the second light reflecting material and the second resin. The cover member is constructed by combining light reflecting materials and resins so as to have a magnitude relationship between the refractive index difference between the first light reflecting material and the first resin, and the refractive index difference between the second light reflecting material and the second resin.

The refractive index difference between the first light reflecting material and the first resin that is composed of a fluorine-based resin is larger than the refractive index difference between the second light reflecting material and the second resin.

Examples of the first light reflecting material and the second light reflecting material include titanium oxide, zirconia, aluminum oxide, silicon oxide, and the like. These can be used singly or in combination of two or more. The first light reflecting material and the second light reflecting material may be of the same type in whole or in part, or may be of different types in whole or in part. The reflecting material content of the resins can be 3 to 50 wt %. The first light reflecting material and the second light reflecting material may he contained in the first cover member 3a and the second cover member 3b with the same content or different contents. Specifically, the first light reflecting material content of the first cover member 3a is preferably greater than the second light reflecting material content of the second cover member 3b. This can make the reflectance of the first cover member higher. In other words, in the cover member 3, more light can be reflected in the positions close to the light source and the emission face to thereby effectively reduce light leakage from the cover member 3.

The first light reflecting material content of the first cover member 3a is, for example, about 45 to 9.0 wt %. The second light reflecting material content of the second cover member 3b is, for example, about 20 to 45 wt %.

The first resin and the second resin may themselves have light reflecting properties or not. They may be thermoplastic resins or thermosetting resins. However, both the first resin and the second resin are preferably thermoplastic resins, or both thermosetting resins. This is for facilitating the manufacturing of the light emitting elements.

The first resin is a fluorine-based resin, in other words, a resin containing fluorine atoms, and as long as it contains fluorine atoms, it may be a perfluorinated resin, partially fluorinated resin, or fluorinated resin copolymer. Examples include polytetrafluoroethylene (PTFE), olychlorotrifluoroethylene (PCTFE, CTFE), perfluoroalkoxy fluorine resin, or a copolymer of these with perfluoroalkyl vinyl ether, hexafluoropropylene, ethylene, or the like, tetrafluoroethylene-hexafluoro propylene copolymer (FEP), ethylene-tetrafluoroethylene copolymer (ETFE), ethylene-chlorolrifluoroethylene copolymer (ECTFE), polyvinylidene difluoride (PVDF), poly(vinyl fluoride) (PVF), and the like.

The second resin may be a fluorine-based resin, but does not have to be a fluorine-based resin. The second resin may be one that is known in the art. Examples of the second resin include, besides the resins containing fluorine atoms described above, thermosetting resins, such as silicone resins, silicone modified resins, epoxy resins, phenol resins, urethane resins, oxetane resins, acrylic resins, polycarbonate, polyimide resins, polyphthalamide, and the like. The second resin may be the same resin as that employed for the first resin, but is preferably a different resin. Specifically, the second resin is more preferably a silicone-based resin. In the case of using a silicone-based resin for the second resin, the fluorine-based resin employed for the first resin is preferably a thermosetting resin as well as the silicone-based resins.

In the first cover member 3a, the refractive index difference between the first resin and the first light reflecting material relative to the light emitted from the light emitting element described later, for example, is preferably 0.4 to 1.4.

In the second cover member 3b, the refractive index difference between the second resin and the second light reflecting material relative to the light emitted from the light emitting element described later, for example, is preferably 0.1 to 1.3.

The refractive index difference in the first cover member 3a is larger than the refractive index difference in the second cover member 3b preferably by 0.1 to 1.5, more preferably by 0.1 to 1.3.

As long as there holds a relationship such that the refractive index difference between the first light reflecting material and the first resin is larger than the refractive index difference between the second light reflecting material and the second resin as described earlier, the first resin may be of the same material as that employed for the second resin, or the first light reflecting material may be of the same light reflecting material as that used for the second light reflecting material.

In one embodiment, the first light reflecting material and the second light reflecting material are preferably of the same material, and the refractive index of the first resin is lower than the refractive index of the second resin.

In another embodiment, the first resin and the second resin may be of the same resin, and the refractive index of the first reflecting material is lower than the refractive index of the second light reflecting material.

The first cover member 3a covers at least the lateral faces of the light emitting element in whole or in part as well as the lateral faces of the light transmissive member 2 in part or whole. The first cover member 3a preferably covers these lateral faces in whole. Moreover, the first cover member 3a preferably covers the lower face of the light emitting element in whole or in part. In the case where the surface area of the light transmissive member 2 is larger than the surface area of the light emitting element as described later, the first cover member preferably further covers part of the lower face of the light transmissive member. "Covering" here may be accomplished via another member, but is preferably covering in contact with the light emitting element.

The second cover member 3b preferably covers the lateral faces of the light emitting element 1 and the lateral faces of the light transmissive member 2 via the first cover member 3a. Moreover, the second cover member 3b preferably further covers the lower face of the light emitting element in part or whole via the first cover member 3a. In the case where the surface area of the light transmissive member 2 is larger than the surface area of the light emitting element, the second cover member preferably further covers part of the lower face of the light transmissive member via the first cover member 3a.

In the case where the light emitting element is mounted on a mounting board as described later, the first cover member 3a and the second cover member 3b, particularly the first cover member 3a, preferably cover the upper face of the mounting board in contact therewith so as not to expose the upper face of the mounting board.

The thickness Ta (FIG. 1B) of the first cover member 3a that covers the lateral faces of the light transmissive member 2, for example, is 0.1 µm to 50 µm.

The thickness Tb (FIG. 1B) of the second cover member 3b that covers the lateral faces of the light transmissive member 2, for example, is 100 µm to 1000 µm. The thicknesses of the first cover member 3a and the second cover member 3b may be uniform across the entire areas, but may be thicker or thinner in part.

The thicker the first cover member 3a, the more preferable it is. The light emitting device 10 in this embodiment including the cover member 3 which includes a first cover member 3a can reduce the light that enters the second cover member 3b, allowing the thickness of the second cover member 3b to be reduced. This can achieve more distinguishable luminance difference between the emission part (i.e., the upper face of the light transmissive member 2) and the non-emission part (i.e., upper face of the cover member 3) of the emission face of the light emitting device 10.

Light Emitting Element 1

Examples of light emitting elements include semiconductor light emitting elements, such as light emitting diodes. The light emitting element 1 includes a semiconductor stack and a pair of electrodes. The semiconductor stack includes three semiconductor layers: a first conductivity semiconductor layer (e.g., n-type semiconductor layer), an emission layer (i.e., active layer), and a second conductivity semiconductor layer (e.g., p-type semiconductor layer). The semiconductor layers can he formed with semiconductor materials, for example, group III-V compound semiconductors, group II-VI compound semiconductors, and the like. Specific examples include nitride-based semiconductor materials such as $In_xAl_yGa_{1-X-Y}N$ ($0 \leq X$, $0 \leq Y$, $X+Y \leq 1$) e.g., InN, AlN, GaN, InGaN, AlGaN, InGaAlN, or the like). Such a semiconductor stack is usually formed on a substrate made of a light transmissive insulating material such as sapphire ($Al_2O_3$) or spinel ($MgAl_2O_4$), or a semiconductor material which allows the emitted light from the semiconductor stack to transmit therethrough (e.g., nitride-based semiconductor material). Such a substrate may be ultimately removed from the semiconductor stack, but does not have to be removed.

The set of electrodes may be formed on one of the faces of the semiconductor stack. Alternatively, respective ones of the set of electrodes may be formed on one face and the other face(s) of the semiconductor stack. Especially, the pair of electrodes is preferably formed on one of the faces of the semiconductor stack. In this manner, the faces without the electrodes serving as the primary light extraction face can entirely be bonded to the light transmissive member to thereby increase the light extraction efficiency. The pair of electrodes can be formed with a good electric conductor, for example, a single layer or multilayer film of a metal, such as Cu, Au, Ag, Ni, Sn.

Shapes of the semiconductor stack and the electrodes can be appropriately selected. Examples include a circle, an ellipse, or a polygon such as a triangle, rectangle, hexagon, in a plan view.

The light emitting element 1 is preferably mounted on a mounting board, but does not have to be mounted on a mounting board. In the case of mounting on a mounting board, flip chip mounting is preferable from the perspective of the light extraction described above.

In the case where the light emitting element 1 is mounted on a mounting board 4, the first cover member 3a can also be disposed between the light emitting element 1 and the mounting board 4. Specifically, the first cover member 3a covers the lower face of the light emitting element 1 and the upper face of the mounting board 4 in the space between the light emitting element 1 and the mounting board 4. On this occasion, preferably, a second cover member 3b is further disposed between the first cover member 3a that covers the lower face of the light emitting element 1 and the first cover member 3a that covers the upper face of the mounting board 4 in the space between the light emitting element 1 and the mounting board 4.

Light Transmissive Member 2

The light transmissive member 2 is disposed on the upper face of the light emitting element 1, and preferably transmits 60% or more, 65% or more, 70% or more, or 80% or more of the light emitted from the light emitting element 1.

The light transmissive member 2 can be formed with a light transmissive material, such as a light transmissive resin, glass, ceramic. Examples of the light transmissive resin include a thermosetting resin such as a silicone resin, silicone modified resin, epoxy resin, and phenol resin, or a thermoplastic resin such as a polycarbonate resin, acrylic resin, methylpentene resin, and polynorbornene resin. Particularly, a silicone resin is suitable due to its highly light resistant and heat resistant. The light transmissive member preferably has a high light transmittance, and is thus usually preferable not to include any additives that reflect, absorb, or scatter light. For example, various fillers may be added to adjust the refractive index of the light transmissive member, or adjust the viscosity of the light transmissive material before curing.

The light transmissive member 2 can contain at least one wavelength conversion substance. For the light, transmissive member 2 containing at least one wavelength conversion substance, it is preferable to employ a sintered body of a wavelength conversion material, or a material formed with any of the light transmissive resins, glass, and ceramics described earlier to which a wavelength conversion substance is added. Examples of wavelength conversion materials include oxide-based, sulfide-based, or nitride-based wavelength conversion substances. In the case of employing a gallium nitride-based light emitting element that emits blue light as the light emitting element, specific examples of wavelength conversion substances include YAG-based and LAG-based wavelength conversion substances, SiAlON-based wavelength conversion substances (β-SiAlON), SGS wavelength conversion substances, SCASN-based and CASN-based wavelength conversion substances, manganese-activated potassium fluorosilicate-based wavelength conversion substances (KSF-based, e.g., $K_2SiF_6$:Mn). and sulfide-based wavelength conversion substances. The YAG-based and LAG-based wavelength conversion substances absorb blue light and emit yellow to green light. The SiAlGN-based wavelength conversion substances and SGS wavelength conversion substances emit green light. The SCASN-based and CASN-based wavelength conversion substances, and manganese-activated potassium fluorosilicate-based wavelength conversion substances (KSF-based, e.g., $K_2SiF_6$:Mn) emit red light. The foregoing wavelength conversion substances can be used singly or in combination.

The wavelength conversion substance content of the fight transmissive member can be, for example, 2 to 50 wt %.

The light transmissive member 2 may contain various fillers such as a light diffusing substance, in addition to the wavelength conversion substance, for example.

The light transmissive member 2 preferably has an outer shape that is the same as the upper face of the light emitting element 1, or larger or smaller than that in a plan view of the light emitting device 10. The outer shape of the light transmissive member 2 can be, for example, a circular shape, an elliptical shape, or a polygonal shape such as a square, rectangle, in a plan view. The light transmissive member 2 preferably has a thickness, for example, of 50 µm to 300 µm.

Method of Manufacturing a Light Emitting Device

The method of manufacturing a light emitting device according to this embodiment includes:

disposing a first mixture 3X containing a first light reflecting material and a first resin composed of a fluorine-based resin surround a light emitting element;

forming a first cover member 3a in contact with the light emitting element 1 by heating the first mixture 3X; and forming a second cover member 3b that covers the first cover member 3a by filling the surrounding region of the first cover member 3a with a second mixture containing a second light reflecting material and a second resin. FIG. 2A to FIG. 2D show examples of the method of manufacturing a light emitting device according to this embodiment.

It is preferable to include, in addition to the steps described above, a step of mounting the light emitting element 1 on a mounting board 4, a step of disposing a light transmissive member 2 on the upper face of the light emitting clement, and the like.

Providing Light Emitting Element

A light emitting element 1 is provided. The light emitting element 1, for example, is preferably mounted on a mounting board. The mounting board preferably has an insulating base provided with a set of wiring layers corresponding to the electrodes of the light emitting element. The base is preferably configured with a material having good heat dissipation properties, and can be formed with, for example, glass, resins (including fiber reinforced resins), ceramics, metals, paper. Examples of resins include epoxy resins, glass epoxy resins, bismaleimide-triazine (BT) resins, polyimide resins. Ceramics include aluminum oxide, aluminum nitride, zirconium oxide, zirconium nitride, titanium oxide, titanium nitride, or their mixtures. Metals include copper, iron, nickel, chromium, aluminum, silver, gold, titanium, or their alloys. For a flexible mounting board, the base may be formed using polyimide, polyethylene terephthalate, polyethylene naphthalate, liquid crystal polymers, cyclo-olefin polymers, for example.

The wiring layers are formed at least on the upper face of the base, and may also be formed inside the base, on the lateral faces and/or on the lower face of the base. The wiring layers can be formed with copper, iron, nickel, tungsten, chromium, aluminum, silver, gold, titanium, palladium, rhodium, or their alloys. They may be of a single layer or multilayer of these metals or alloys. From the heat dissipation perspective, copper or a copper alloy is particularly preferable.

The light emitting element can be flip chip mounted by connecting the set of electrodes on the corresponding set of wiring layers using a conductive member. Examples of the conductive members include bumps whose main component is gold, silver, copper or the like; a metal paste containing a resin binder with metal powder of silver, gold, copper, platinum, aluminum, palladium, or the like; tin-bismuth-based, tin-copper-based, tin-silver-based, gold-tin-based solder; and brazing materials, such as low melting point metals, and the like.

It is preferable to dispose a light transmissive member on the upper face of the light emitting element before or after mounting the light emitting element on the mounting board. The light transmissive member can be fixed to the upper face of the light emitting element using, for example, a light transmissive adhesive. An adhesive composed of a resin or the like known in the art can be used. To fix the light emitting element and the light transmissive member, direct bonding by crimping, sintering, surface activated bonding, atomic diffusion bonding, hydroxylgroup bonding, or the like can alternatively be employed.

Disposing First Mixture

A first mixture is prepared beforehand. The first mixture contains a first light reflecting material and a first resin. The first resin is composed of a fluorine-based resin The first mixture can be prepared by adding and mixing the first light reflecting material with the first resin. It is preferable to employ the first resin that is a slurry or solution using an appropriate solvent such as an organic solvent. The first resin content of the slurry or solution is preferably about 5 to 20 wt %. The first light reflecting material content of the first mixture is preferably about 10 to 30 wt %. In order to adjust the viscosity, an additive such as a filler or the like can be further added to the first mixture.

Figure 2A:
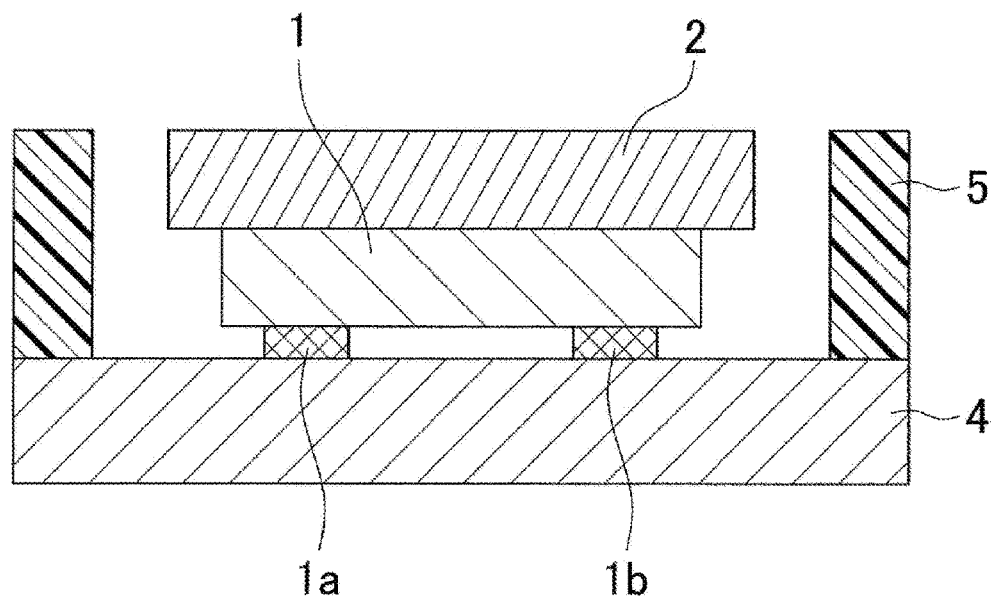
FIG. 2A is a schematic cross-sectional view to show a process for illustrating the method of manufacturing the light emitting device shown in FIG. 1A.
Figure 2B:
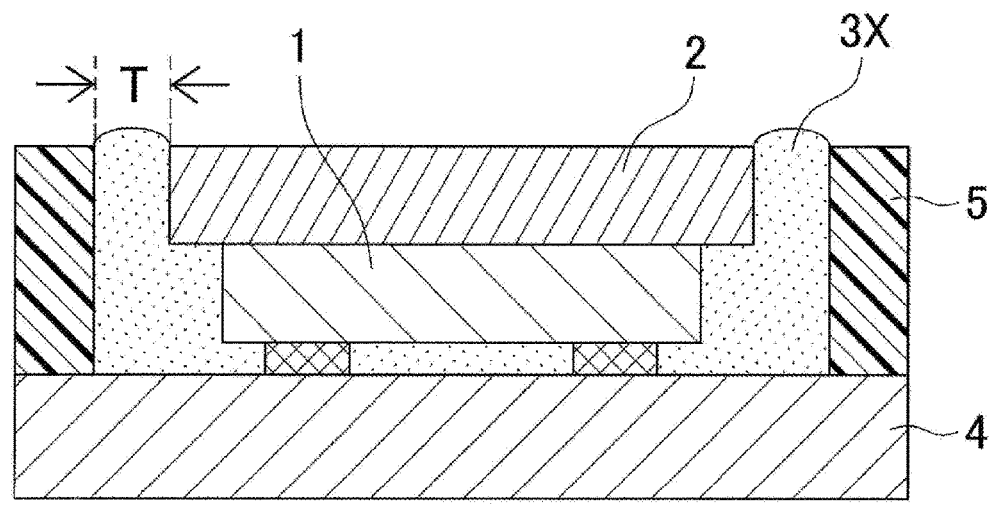
FIG. 2B is a schematic cross-sectional view to show a process for illustrating the method of manufacturing the light emitting device shown in FIG. 1A.

As shown in FIG. 2B, the first mixture 3X is disposed to surround the light emitting element 1. Depending on the viscosity or the like of the first mixture 3X, a frame 5 that serves as a dam for tie first mixture 3X is preferably positioned in the region that surrounds the light emitting element 1 as shown in FIG. 2A, for example. The first mixture 3X may be disposed in the surrounding region of the light emitting element 1 by using a dispenser, or applied by way of spraying or the like. The first mixture 3X is preferably surrounds the light emitting element 1 so that its upper face bulges as shown, for example, in FIG. 2B, considering the shrinkage of the first resin in a later step. It is preferable to arrange the frame 5 or dispose the first mixture in the surrounding region of the light emitting element 1 so that the thickness of the first mixture 3X at the lateral faces of the light emitting element (e.g., T in FIG. 2B) is 100 µm to 1000 µm. The first mixture 3X is preferably not disposed to the upper face of the light emitting element 1. The first mixture 3X is also disposed between the light emitting element 1 and the mounting board 4, in the case where the light transmissive member 2 is disposed on the upper face of the light emitting element 1, moreover, the first mixture 3X is preferably not disposed to the upper face of the light transmissive member 2. However, in the event that the first mixture 3X was applied to the upper face of the light emitting element or the upper face of the light transmissive member, the first mixture 3X or the first cover member 3a present on these upper faces can simply be completely removed in a later step. The removal of the first mixture 3X or the first cover member 3a can be accomplished by way of a method known in the art, for example, by high pressure water rinsing subsequent to forming the second cover member.

Forming First Cover Member 3a

Figure 2C:
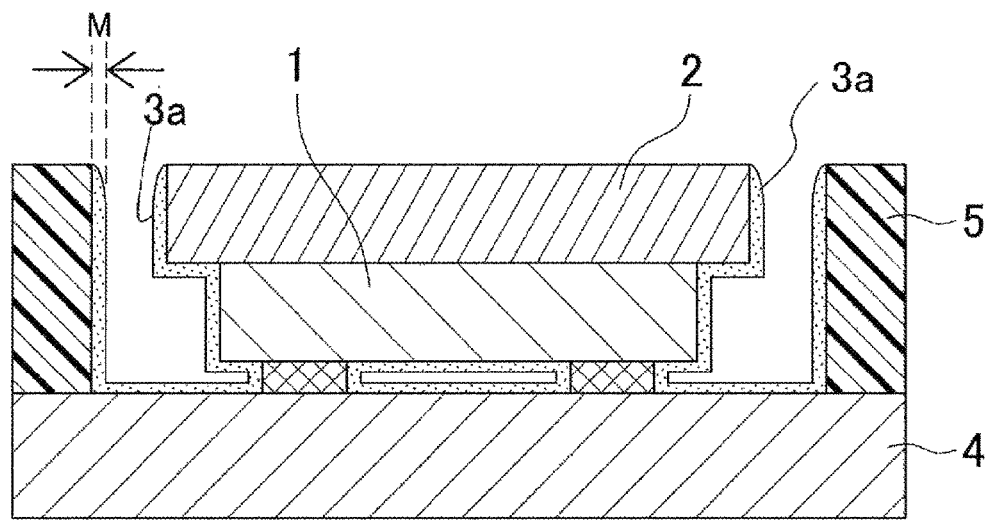
FIG. 2C is a schematic cross-sectional view to show a process for illustrating the method of manufacturing the light emitting device shown in FIG. 1A.
Figure 2D:
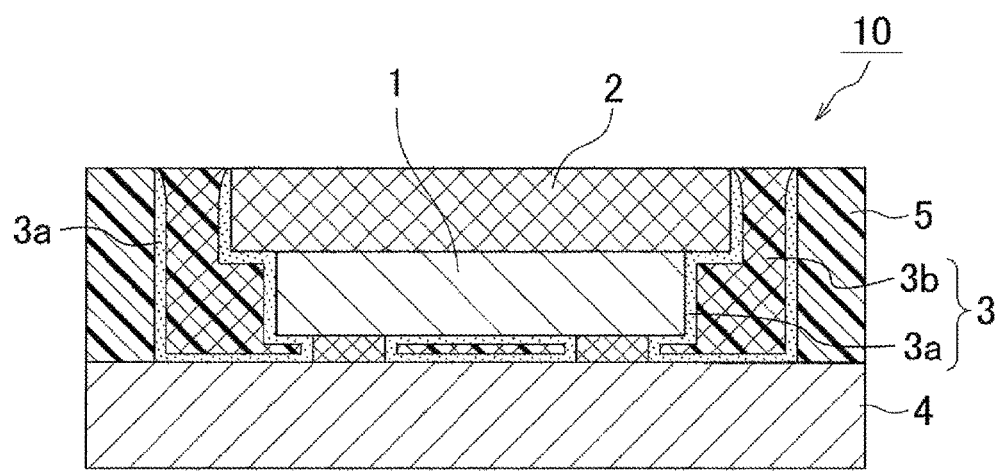
FIG. 2D is a schematic cross-sectional view to show a process for illustrating the method of manufacturing the light emitting device shown in FIG. 1A.

Subsequently, the first mixture 3X surrounding the light emitting element 1 is heated. Heating here is performed together with the light emitting element 1. Examples of heating methods include heating by using a hot plate or laser beam irradiation, heating in an oven, and the like. The heating temperature can be suitably adjusted depending on the type of the first resin employed, for example, 60 to 300° C., preferably 80 to 200° C. The heating time is, for example, 1 to 5 hours. By way of heating as described above, the first cover member 3a is baked as shown in FIG. 2C. In the case where a light transmissive member 2 is disposed on the light emitting element 1, the first mixture 3X shrinks while clinging to the light emitting element 1 and the light transmissive member 2 to be formed into the first cover member 3a in contact with and covering the lateral faces of these members. The first cover member 3 a will have a smaller thickness (e.g., M in FIG. 2C) than that of the first mixture 3X as the first mixture 3X shrinks during curing, In this case, if the light emitting element 1 is mounted on the mounting board 4, the first mixture disposed onto the mounting board 4 would shrink by being heated while also clinging to and covering the upper face of the mounting board.

The upper ends of the lateral faces of the light emitting element, or the upper ends of the lateral faces of the light transmissive member if the light transmissive member is disposed on the light emitting element might occasionally be covered with the first resin with a reduced film thickness due to shrinkage, and even be exposed depending on the situation. However, by disposing the first mixture so that the upper face bulges in the step of disposing the first mixture described above, situations such as having a thin film or being exposed can be prevented.

For example, the shrinkage of the first mixture occurs as the solvent contained in the first resin is evaporated. In other words, the solvent in the first mixture is evaporated by heating the first mixture that is a slurry or solution containing the first resin with a solvent, resulting in reduction in the volume of the first mixture. The first light reflecting material and the first resin both cling to and cover the first light emitting element 1 and the light transmissive member 2 while shrinking as the solvent is evaporated off.

By employing the first resin that is a slurry or solution using a solvent, the first light reflecting material content of the first mixture can be increased. The solvent of the first resin is subsequently evaporated by curing the first resin, whereby the first cover member can be formed with high content of the first light reflecting material. Here, "high content" means that the content of the first light reflecting material in the first cover member, for example, is 50 wt % or higher.

Figure 1C:
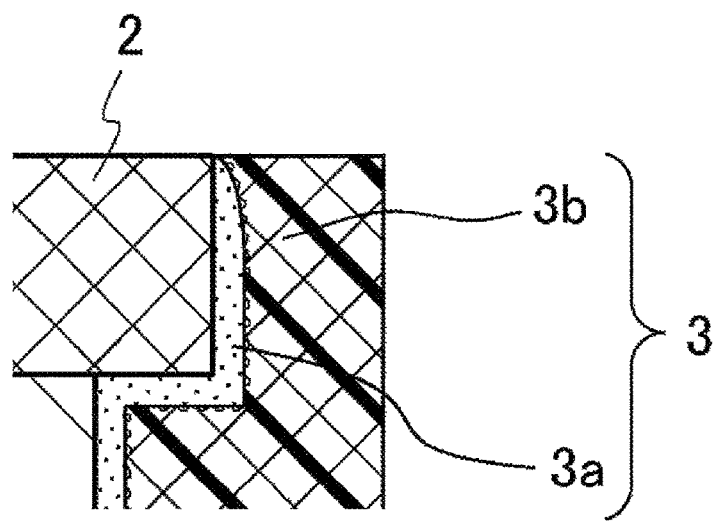
FIG. 1C is an enlarged view of the pertinent part of FIG. 1B.

As shown in FIG. 1C, the first cover member preferably has protrusions and recesses on the surface. The first cover member having protrusions and recesses on the surface can be formed with high content of the first light reflecting material. In other words, the first cover member preferably includes with high content of the first light reflecting material, as well as having protrusions and recesses attributable to the first light reflecting material. This can improve the adhesion of the first cover member 3a to the second cover member 3b described later.

The frame 5 may be removed after forming the first cover member or after forming the second cover member.

Forming Second Cover Member 3b

As shown in FIG. 1A and FIG. 1B, the second cover member 3b is disposed in the surrounding region of the first cover member. The second cover member 3b that covers the first cover member is formed by filling and curing the second mixture containing the second light reflecting material and the second resin.

The second mixture can be prepared by utilizing, for example, a similar method to that used to prepare the first mixture.

The filling of the second mixture can be accomplished by utilizing various methods, such as applying with a dispenser or spray, or printing and the like.

The second mixture is preferably not applied to the upper face of the light emitting element 1, or the upper face of the light transmissive member 2 if the light transmissive member 2 is disposed on the upper face of the light emitting element 1. If the second mixture is applied to the upper face of the light emitting element or the upper face of the light transmissive member, the second mixture or the second cover member 3b present on these upper faces can simply he removed in a later manufacturing step. The removal of the second mixture or the second cover member can be accomplished by any method known in the art, such as high-pressure water rinsing.

Preferably, the upper face of the second cover member 3b is substantially flush with the upper face of the light transmissive member 2. This is to securely cover the lateral laces of the light transmissive member 2 with the second cover member 3b even if the first cover member 3a has shrunk and receded from the upper portions of the lateral faces of the fight transmissive member 2. This can discourage or prevent light leakage from the lateral lace regions of the light transmissive member 2, thereby improving the efficiency of light extraction from the light emitting element and increasing the luminous flux extracted from the light emitting element.

The second cover member 3b can be hardened by utilizing a method known in the art depending on the type of the second resin used, such as thermal curing, and the like.

As described above, the cover member 5 has the double cover structure in which the first cover member covers the lateral faces of the light emitting element and the second cover member further covers the first cover member. In addition, the first cover member having a large refractive index difference is in contact with the light emitting element, the emitted light from the light emitting element can be effectively reflected. This can effectively prevent or attenuate leakage of the light from the lateral faces of the light emitting element. As a result, the luminous flux output from the light extraction face can be further increased.

In the case of a cover member configured with a resin and a light reflecting material having a large refractive index difference therebetween, in particular, it is generally difficult to dispose the cover member at appropriate locations with appropriate thicknesses or sizes because the resin shrinks extensively as it cures. As described above, however, by disposing the second cover member so as to cover the first cover member containing a resin and a light reflecting material having a larger refractive index difference therebetween, the emitted light from the light emitting element can be securely reflected by the first cover member, and appropriate thicknesses and sizes at appropriate locations can be ensured by the second cover member as the two cover members act in a coordinated fashion. This can prevent or attenuate leakage of the light from the lateral faces of the light emitting element, thereby increasing the luminous flux extracted from the upper face of the light emitting element, or the upper face of the light transmissive member if the light transmissive member is disposed on the upper face of the light emitting element.

What is claimed is:

1. A light emitting device comprising:
a mounting board;
a light emitting element mounted on an upper face of the mounting board;
a light transmissive member disposed on an upper face of the light emitting element; and
a cover member having light reflectivity, the cover member covering a lateral face of the light emitting element, a lateral face of the light transmissive member, at least a part of a lower face of the light emitting element and at least a part of an upper face of the light emitting element, the cover member including
a first cover member disposed adjacent to the lateral face of the light emitting element, the lateral face of the light transmissive member, the part of the lower face of the light emitting element, and the part of the upper face of the mounting board, and containing a first light reflecting material and a first resin composed of a fluorine-based resin, and
a second cover member covering the first cover member, and containing a second light reflecting material and a second resin, the second cover member further being arranged within a gap defined by the first cover member between the part of the lower face of the light emitting element and the part of the upper face of the mounting board,
a refractive index difference between the first light reflecting material and the first resin being larger than a refractive index difference between the second light reflecting material and the second resin.

2. The light emitting device according to claim 1, wherein the first light reflecting material and the second light reflecting material are of the same material, and
a refractive index of the first resin is lower than a refractive index of the second resin.

3. The light emitting device according to claim 1, wherein the second resin is a silicone-based resin.

4. The light emitting device according to claim 1, wherein the first cover member has a smaller thickness than the second cover member.

5. The light emitting device according to claim 1, wherein the first cover member is in contact with the part of the upper face of the mounting board.

6. The light emitting device according to claim 1, wherein a first reflecting material content of the first cover member is greater than a second light reflecting material content of the second cover member.

7. The light emitting device according to claim 1, wherein the light transmissive member contains at least one wavelength conversion substance.

8. A method of manufacturing a light emitting device comprising:
disposing a first mixture containing a first light reflecting material and a first resin composed of a fluorine-based resin to surround a light emitting element mounted on a mounting board;
forming a first cover member in contact with the light emitting element by heating the first mixture so that the first mixture shrinks and clings to a surface of the light emitting element, and the first mixture disposed between the light emitting element and the mounting board shrinks and clings to a lower face of the light emitting element and an upper face of the mounting board to define a gap between the lower face of the light emitting element and the upper face of the mounting board; and
forming a second cover member covering the first cover member by disposing a second mixture containing a second light reflecting material and a second resin to surround the first cover member and within the gap defined by the first cover member between the lower face of the light emitting element and the upper face of the mounting board.

9. The method of manufacturing a light emitting device according to claim 8, wherein
the first resin is a slurry or solution using a solvent.

10. The method of manufacturing a light emitting device according to claim 8, further comprising:
providing a frame to surround the light emitting element, wherein
the disposing of the first mixture includes disposing the first mixture inside the frame.

11. The method of manufacturing a light emitting device according to claim 8, further comprising:
disposing a light transmissive member on an upper face of the light emitting element prior to the disposing of the first mixture, wherein
the disposing of the first mixture includes disposing the first mixture on a lateral face of the light emitting element and a lateral face of the light transmissive member.

12. The method of manufacturing a light emitting device according to claim 8, wherein
the first light reflecting material and the second light reflecting material are the same material, and a refractive index of the first resin is lower than a refractive index of the second resin.

13. The method of manufacturing a light emitting device according to claim 8, wherein
the second resin is a silicone-based resin.

14. The method of manufacturing a light emitting device according to claim 8, wherein
the forming of the second cover member includes forming the second cover member to have a thickness greater than a thickness of the first cover member.

15. The method of manufacturing a light emitting device according to claim 8, wherein
the disposing of the first mixture includes disposing the first mixture on the mounting board.

16. A light emitting device comprising:
a mounting board;
a light emitting element mounted on an upper face of the mounting board;
a light transmissive member disposed on an upper face of the light emitting element; and
a cover member having light reflectivity, the cover member covering a lateral face of the light emitting element, a lateral face of the light transmissive member, at least a part of a lower face of the light emitting element and at least a part of an upper face of the light emitting element, the cover member including a first cover member disposed adjacent to the lateral face of the light emitting element, the lateral face of the light transmissive member, the part of the lower face of the light emitting element, and the part of the upper face of the mounting board, and contains a first light reflecting material and a fluorine-based first resin, and a second cover member covering the first cover member, and containing a second light reflecting material and a second resin, the second cover member further being arranged within a gap defined by the first cover member between the part of the lower face of the light emitting element and the part of the upper face of the mounting board.

17. The light emitting device according to claim 1, wherein
an outer surface of the first cover member has protrusions and recesses.

18. The light emitting device according to claim 1, wherein
the light emitting element includes a pair of electrodes, and
the gap defined by the first cover member is arranged between the electrodes.

19. The method of manufacturing a light emitting device according to claim 8, wherein
the forming of the first cover member includes forming the first cover member having protrusions and recesses on an outer surface.

20. The method of manufacturing a light emitting device according to claim 8, wherein
the forming of the first cover member includes defining the gap by the first cover member between a pair of electrodes of the light emitting element.

* * * * *